United States Patent
Swoboda

(10) Patent No.: US 6,836,882 B2
(45) Date of Patent: Dec. 28, 2004

(54) PIPELINE FLATTENER FOR SIMPLIFYING EVENT DETECTION DURING DATA PROCESSOR DEBUG OPERATIONS

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 590 days.

(21) Appl. No.: 09/798,425

(22) Filed: Mar. 2, 2001

(65) Prior Publication Data

US 2003/0061019 A1 Mar. 27, 2003

Related U.S. Application Data

(60) Provisional application No. 60/186,326, filed on Mar. 2, 2000, and provisional application No. 60/219,340, filed on Mar. 2, 2000.

(51) Int. Cl.[7] .............................................. G06F 9/44
(52) U.S. Cl. ..................... 717/134; 717/124; 717/161
(58) Field of Search ............................... 717/161, 124, 717/134

(56) References Cited

U.S. PATENT DOCUMENTS

| | | | | |
|---|---|---|---|---|
| 4,985,825 A | * | 1/1991 | Webb et al. ................. 711/169 |
| 5,828,824 A | | 10/1998 | Swoboda ............... 395/183.01 |
| 5,943,498 A | * | 8/1999 | Yano et al. .................. 717/128 |
| 6,138,230 A | * | 10/2000 | Hervin et al. ................ 712/216 |
| 6,412,062 B1 | * | 6/2002 | Xu et al. ....................... 712/40 |
| 6,446,029 B1 | * | 9/2002 | Davidson et al. ............ 702/186 |
| 6,549,930 B1 | * | 4/2003 | Chrysos et al. .............. 718/104 |
| 6,549,959 B1 | * | 4/2003 | Yates et al. .................... 710/22 |
| 6,591,378 B1 | * | 7/2003 | Arends et al. ................. 714/38 |

OTHER PUBLICATIONS

Jundi, Khaled and Moon, Dr. Don, "Monitoring Techniqes for Risc Embedded Systems", 8/93, IEEE, retrieved fro IEEE database Jan. 13, 2004.*

Sato, Toshinori, "A Simulation Study of Pipelining and Decoupling a Dynamic Instruction Scheduling Mechanism", Euromicro Conference 1999, retrieved from IEEE database Jan. 13, 2004.*

Sawada, Jun, "Design Verification of Advanced Pipelined Machines", Dissertation Proposal, Aug. 19, 1996, retrieved from citeseer.com Jan. 12, 2004.*

Tullsen, Dean M., Brown, Jeffery A., Handling Long–latency Loads in Simultaneous Multithreading Processor, Dept of CS and Engineering, Univ of CA San Diego, 2001 IEEE, retrieved from ACM Portal database 01/13/204.*

ARM Limited, RDI 1.5. 1tx and RDI 1.5. 1rt; May 19, 2000; pp. 1–55.

ARM Limited ETM9, Rev. 1, Technical Reference Manual, pp. i—index–3.

ARM Limited, Embedded Trace Macrocell, Rev. 1, Specification, pp. i—index–3.

* cited by examiner

Primary Examiner—Tuan Dam
Assistant Examiner—Mary Steelman
(74) Attorney, Agent, or Firm—Robert D. Marshall, Jr.; W. James Brady, III; Frederick J. Telecky, Jr.

(57) ABSTRACT

Pipeline activity information associated with all stages of execution of an instruction in an instruction pipeline of a data processor is presented to an event detector in timewise aligned format. This permits events in the pipeline to be presented to the event detector in a sequence that is consistent with the context in which a programmer of the event detector would normally think of those events, thereby simplifying programmation of the event detector.

4 Claims, 2 Drawing Sheets

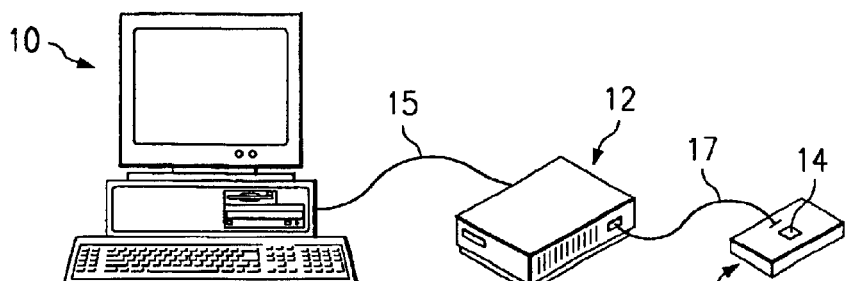
FIG. 1
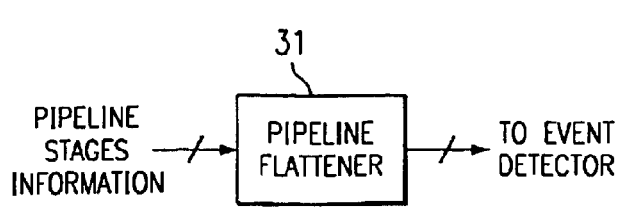
FIG. 2
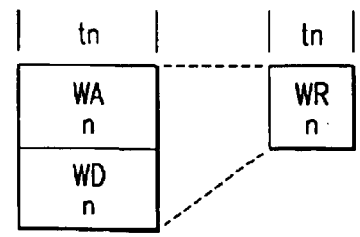
FIG. 3
FIG. 7

PIPELINE FLATTENER FOR SIMPLIFYING EVENT DETECTION DURING DATA PROCESSOR DEBUG OPERATIONS

This application claims the priority under 35 U.S.C. 119(e) (1) of the following now abandoned U.S. provisional applications: No. 60/186,326 filed on Mar. 2, 2000; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances Of IC design, for example, are accompanied by decreased internal visibility and control, reduced fault coverage and reduced ability to toggle states, more test development and verification problems, increased complexity of design simulation and continually increasing cost of CAD (computer aided design) tools. In board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility".

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

BRIEF DESCRIPTION OF THE DRAWINGS

FIG. 1 diagrammatically illustrates exemplary embodiments of an emulation system according to the invention.

FIG. 2 is a timing diagram which illustrates exemplary pipeline activity in a pipelined data processor.

FIG. 3 diagrammatically illustrates pertinent portions of exemplary embodiments of the target processor of FIG. 1.

FIG. 7 illustrates a relationship between the respective write pipeline stages shown in FIGS. 2 and 6.

DETAILED DESCRIPTION

Figure 4:
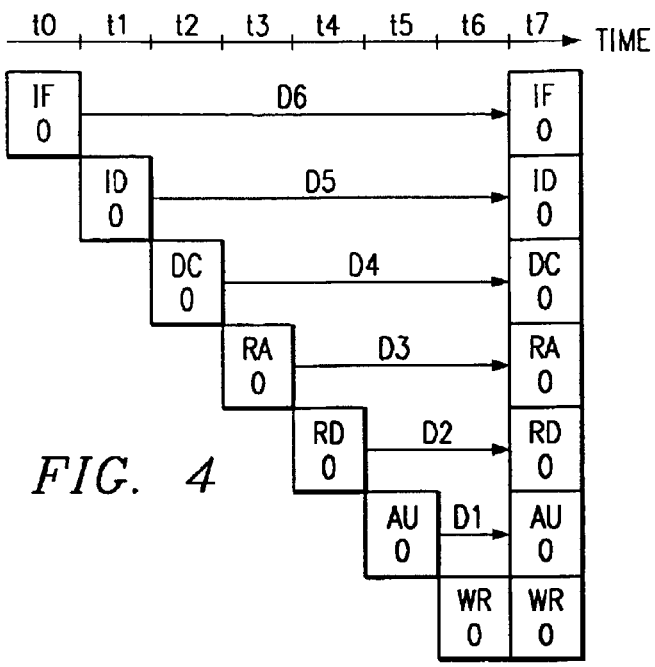
FIG. 4 is a timing diagram which illustrates exemplary operations which can be performed by the pipeline flattener of FIG. 3.

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug functions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:

1. Real-time Emulation (RTE);
2. Real-time Data Exchange (RTDX™ a trademark of Texas Instruments Incorporated);
3. Trace; and
4. Advanced Analysis.

These components address visibility and control needs as shown in Table 1.

TABLE 1

Emulation System Architecture and Usage

| Architectural Component | Visibility Provisions | Control Provisions | Debug Usage |
|---|---|---|---|
| RTE | Static view of the CPU and memory state after background program is stopped. Interrupt driven code continues to execute. | Analysis components are used to stop execution of background program. | Basic debug Computational problems Code design problems |
| RTDX ™ | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application. | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX ™ |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers both bi-directional and uni-directional DSP target/host data transfers facilitated by the emulator. The DSP (or target) application may collect target data to be transferred to the host or receive data from the host, while emulation hardware (within the DSP and the emulator) manages the actual transfer. Several RTDX™ transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

Existing logic analyzer like technology does not, however, provide a solution to decreasing visibility due to higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);

Memory data references made by the DSP core or chip level peripherals (Data reads and writes);

Application specific signals and data (ASIC activity); and

CPU collected data.

Collection mechanisms for the four classes of trace data are modular allowing the trade off of functionality verses gates and pins required to meet desired bandwidth requirements.

The RTDX™ and Trace functions provide similar, but different forms of visibility. They differ in terms of how data is collected, and the circumstances under which they would be most effective. A brief explanation is included below for clarity.

RTDX™ (Real Time Data eXchange) is a CPU assisted solution for exchanging information; the data to be exchanged have a well-defined behavior in relation to the program flow. For example, RTDX™ can be used to record the input or output buffers from a DSP algorithm. RTDX™ requires CPU assistance in collecting data hence there is definite, but small, CPU bandwidth required to accomplish this. Thus, RTDX™ is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX™ can exchange data in either direction although unidirectional forms of RTDX are supported (data logging). The Trace data path can also be used to provide very high speed uni-directional RTDX™ (CPU collected trace data).

The high level features of Trace and RTDX™ are outlined in Table 2.

TABLE 2

RTDX ® and Trace Features

| Features | RTDX ™ | Trace |
|---|---|---|
| Bandwidth/pin | Low | High |
| Intrusiveness | Intrusive | Non-intrusive |
| Data Exchange | Bi-directional or uni-directional | Export only |
| Data collection | CPU assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX™. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX™ and Real-Time Emulation. This architectural component identifies events, tracks event sequences, and assigns actions based on their occurrence (break execution, enable/disable trace, count, enable/disable RTDX™, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:
1. debugger application program;
2. host computer;
3. emulation controller; and
4. on-chip debug facilities.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest. Trace displays are automatically correlated to the source code that generated the trace log. The emulator provides both the debug control and trace recording function.

The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:

Ethernet 10T and 100T, TCP/IP protocol;

Universal Serial Bus (USB), rev 1.x;

Firewire, IEEE 1394; and/or

Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:

Real-time Emulation;

RTDX™;

Trace; and

Advanced Analysis.

Additionally, the emulator-to-target interface supports:

Input and output triggers;

Bit I/O; and

Managing special extended operating modes.

The emulation controller 12 accesses Real-time Emulation capabilities (execution control, memory, and register access) via a 3, 4, or 5 bit scan based interface. RTDX™ capabilities can be accessed by scan or by using three higher bandwidth RTDX™ formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port.

The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at 17. Debug, Trace, Triggers, and RTDX™0 capabilities share the target cable, and in some cases, the same device pins.

FIG. 2 is a timing diagram which illustrates exemplary pipeline activity exhibited by a target processor, for example the processor shown at 14 in FIG. 1, with a pipelined architecture. FIG. 2 exhibits the following exemplary pipeline stages: Instruction Fetch IF; Instruction Data ID; Instruction Decode DC; Read Address RA; Read Data RD; Arithmetic Unit Operation AU; and Write WR. As shown in FIG. 2, a new seven-stage instruction begins with each new clock cycle (t0–t12).

Assume now, for example, that a debug event detector such as a state machine has been programmed to detect a sequence as indicated below:

State 0:
If (IF0=0×55) then goto State 1
State 1:
If (RA1=0×50 and RD1=0×9999) then goto State 2
State 2:
If (IF2=0×90) then goto State 3
State 3:
Trigger The events which drive the foregoing exemplary state machine sequence are highlighted in FIG. 2. In this example, the programmer wishes to detect the following sequence of events. The execution of an instruction represented by instruction fetch 0 (IF0) followed by a read operation represented by RA1 (Read Address 1) and RD1 (Read Data 1) followed by the execution of an instruction represented by instruction fetch 2 (IF2). If this event sequence is to be detected from observation of conventional pipeline activity (e.g. as shown in FIG. 2), then the sequence must be specified in a different order from the order in which the programmer would normally (and most conveniently) think of the sequence.

More particularly, the programmer would normally, and most conveniently, think of the foregoing sequence in the following context: First, all activities of the seven pipeline stages of instruction 1 occur; second, all activities of the seven pipeline stages of instruction 2 occur, etc. In fact, the foregoing state machine sequence is programmed according to this way of thinking about the sequence of events. Unfortunately, due to the pipeline effect illustrated in FIG. 2, all of the desired events can occur as shown in FIG. 2 but, due to the state machine programming, the state machine will not progress from state 2 to state 3 and therefore will not trigger. The state machine will not progress from state 2 into state 3 because the state machine programmation assumes that the events RA1 and RD1 will precede the event IF2. That is, the state machine has been designed with the aforementioned presumption that all activities associated with all pipeline stages of instruction 1 will occur, after which all activities associated with all pipeline stages of instruction 2 will occur. As shown in FIG. 2, this is not the case, inasmuch as event IF2 actually occurs before either of events RA1 or RD1, so the state machine will not progress from state 2 to state 3 as desired. The foregoing state machine programmation would be correct if IF2 were replaced in the desired sequence by IF6, because event IF6 occurs after events RA1 and RD1 so the state machine would advance from state 2 to state 3 as desired.

The event ordering problem described above indicates that the state machine programmation should preferably anticipate the pipeline effects and the relative proximity of events, for example the proximity of event IF0 to event IF2. Anticipating the pipeline effects and the proximity of various events can be particularly difficult when, for example, the event sequence to be detected is related entirely to read and write operations. In such situations, the state machine programmation would be set up not knowing the relationship of the reads and the writes in the pipeline. If it is assumed that the read and write positioning in the pipeline will influence the event sequence, then the detection sequence would be specified in a different manner than if it were assumed that the read and write positioning in the pipeline does not influence the event sequence (i.e., the first event has cleared the pipeline before the second event happens). Because it is impossible to know what instruction sequence and event proximity will generate the desired read and write sequence, no matter how the state machine is programmed, it can still either fail to detect a legitimate sequence, or falsely indicate that a legitimate sequence has been detected.

These problems are addressed according to exemplary embodiments of the invention by timewise aligning all pipeline stage activities of a given instruction with the activity of the last pipeline stage of that instruction. This timewise alignment of the activities of all pipeline stages of a given instruction advantageously permits the programmer to program the state machine or other detection logic according to the way that the programmer would normally think of the sequence of events that is to be detected.

The aforementioned timewise alignment of the activities of all pipeline stages of a given instruction can be accomplished according to the invention by a pipeline flattener such as illustrated at 31 in FIG. 3. The pipeline flattener receives, for example, the pipeline activity information for each stage in the seven-stage pipeline sequence illustrated in FIG. 2. At the pipeline flattener input, the pipeline activity information can be arranged in the sequential format (see FIG. 2) that is conventionally provided to event detectors. For each instruction, the pipeline flattener 31 is operable to arrange the pipeline activity information from the first six pipeline stages in timewise alignment with the pipeline activity information from the seventh pipeline stage. This timewise aligned pipeline stage information is then provided by the pipeline flattener 31 to the event detector, for example a state machine or other suitable event detection logic.

FIG. 4 is a timing diagram which illustrates exemplary operations which can be performed by the pipeline flattener 31 of FIG. 3. In the example of FIG. 4, the pipeline flattener operates on instruction 0 of FIG. 2 (other instructions have been omitted for clarity). In FIG. 4, the time scale proceeds horizontally in the same fashion as illustrated in FIG. 2. However, in FIG. 4, the pipeline stages are also offset from one another in the vertical direction in order to clearly illustrate the pipeline flattener operation. As shown in the example of FIG. 4, all activities of all pipeline stages are timewise aligned at time t7, the first clock cycle after execution of instruction 0 has been completed. The last pipeline stage of instruction 0, namely the write stage WR, exits the pipeline at time t7, after its execution at time t6. Thus, at time t7, the activities of all pipeline stages can be timewise aligned for presentation to the event detector. As shown in FIG. 4, this timewise alignment requires that each of the pipeline stages other than the WR stage be delayed by an appropriate amount. In particular, the IF stage is delayed by six clock cycles (D6), the ID stage is delayed by five clock cycles (D5), the DC stage is delayed by four cycles (D4), the RA stage is delayed by three clock cycles (D3), the RD stage is delayed by two clock cycles (D2), and the AU stage is delayed by one clock cycle (D1). By implementing these time delays with respect to the first six pipeline stages, the pipeline flattener is able to present all seven pipeline stages in timewise alignment at time t7.

Figure 5:
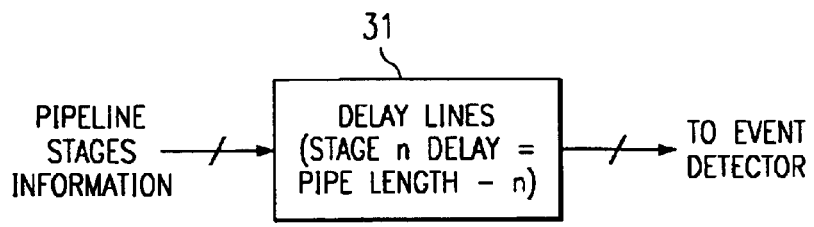
FIG. 5 diagrammatically illustrates exemplary embodiments of the pipeline flattener of FIG. 3.

FIG. 5 diagrammatically illustrates exemplary embodiments of the pipeline flattener of FIG. 3. As shown in FIG. 5, the pipeline flattener 31 is embodied as a plurality of delay lines which appropriately delay all but the last pipeline stage of each instruction, for example the first six pipeline stages of the seven stage pipeline of FIGS. 2 and 4. As shown in FIG. 5, the delay associated with a given pipeline stage n is equal to the pipeline length minus n. For example, in FIG. 4, the delay associated with the fourth pipeline stage RA (n=4) is 7−4=3 clock cycles.

Figure 6:
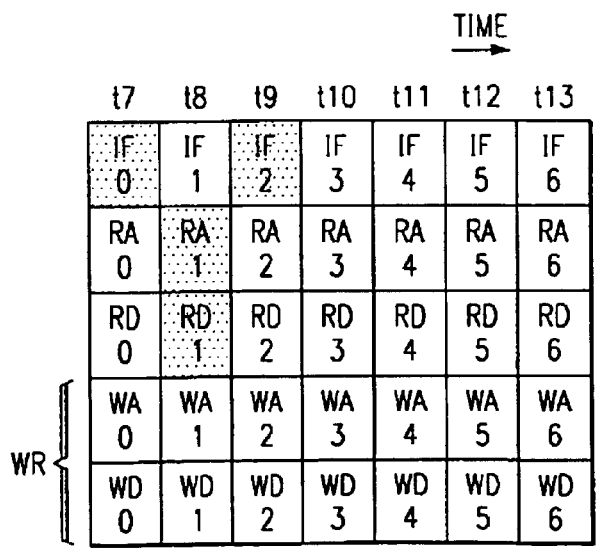
FIG. 6 is a timing diagram which illustrates an example of the output of the pipeline flattener of FIGS. 3 and 5.

FIG. 6 is a timing diagram which illustrates an example of the output of the pipeline flattener of FIGS. 3 and 5 in response to the pipeline stage information of the seven instructions of FIG. 2. In FIG. 6, the ID, DC and AU stages are omitted for purposes of clarity. It should also be noted that the WR pipeline stage of FIG. 2 is illustrated in FIG. 6 as a two-part pipeline stage including a write address portion WA and a write data portion WD. This relationship is illustrated in FIG. 7, which shows that, in some embodiments, the WR stage includes concurrent WA and WD sub-stages.

In FIG. 6, the pipeline stages of instruction 0 are timewise aligned at time t7, and the pipeline stages of instructions 1–6 are respectively timewise aligned at times t8–t13. The events that are highlighted in FIG. 2 are also highlighted in FIG. 6, thereby clearly illustrating that the desired events will now be presented to the event detector in a sequence that is consistent with the context in which the programmer would normally think of those events. Therefore, the state machine described in the above example would detect the desired events when provided with the pipeline flattener output illustrated in FIG. 6.

Although exemplary embodiments of the invention are described above in detail, this does not limit the scope of the invention, which can be practiced in a variety of embodiments.

What is claimed is:

1. A method of providing data processor pipeline activity information to an emulation event detector, comprising:

receiving pipeline activity information associated with all stages of execution of all instructions in an instruction pipeline of a data processor;

timewise aligning the pipeline activity information associated with all pipeline stages of execution of each instruction in the instruction pipeline of the data processor by delaying pipeline activity information from each pipeline stage of a particular instruction until the time of a last pipeline stage of that instruction; and presenting to an event detector the timewise aligned pipeline activity information from all stages of execution of each instruction in the instruction pipeline of the data processor whereby all pipeline activity associated with an instruction is presented to the event detector before any pipeline activity associated with an instruction later in the instruction pipeline is presented to the event detector.

2. The method of claim 1, wherein said aligning step includes delaying presentation of the received pipeline activity information corresponding to each pipeline stage is delayed by a different amount than the activity information associated with any other delayed pipeline stage.

3. An apparatus for providing data processor pipeline activity information to an emulation event detector, comprising:

an input for receiving pipeline activity information associated with all stages of execution of all instructions in an instruction pipeline of a data processor;

a pipeline flattener coupled to said input for timewise aligning the pipeline activity information associated with all pipeline stages of execution of each instruction in the instruction pipeline, said pipeline flattener including a delay for each pipeline stage having a delay amount to delay received pipeline activity from each pipeline stage of a particular instruction until the time of a last pipeline stage of that instruction; and an output coupled to said pipeline flattener for presenting to an event detector the timewise aligned pipeline activity information from all stages of execution whereby all pipeline activity associated with an instruction is presented to the event detector before any pipeline activity associated with an instruction later in the instruction pipeline is presented to the event detector.

4. The apparatus of claim 3, wherein said pipeline flattener is operable for delaying presentation of the received pipeline activity information corresponding to each pipeline stage is delayed by a different amount than the activity information associated with any other delayed pipeline stage.

* * * * *